US008664095B2

(12) United States Patent  
Javey et al.

(10) Patent No.: US 8,664,095 B2  
(45) Date of Patent: Mar. 4, 2014

(54) BLACK GE BASED ON CRYSTALLINE/AMORPHOUS CORE/SHELL NANONEEDLE ARRAYS

(75) Inventors: Ali Javey, Emeryville, CA (US); Yu-Lun Chueh, Hsinchu (TW); Zhiyong Fan, Clear Water Bay (HK)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/332,743

(22) Filed: Dec. 21, 2011

(65) Prior Publication Data

US 2012/0161290 A1  Jun. 28, 2012

Related U.S. Application Data

(60) Provisional application No. 61/426,166, filed on Dec. 22, 2010.

(51) Int. Cl.  
*H01L 21/20* (2006.01)

(52) U.S. Cl.  
USPC ............................ 438/479; 257/613; 257/616

(58) Field of Classification Search  
USPC .................... 257/76, 616, E21.126, E21.132, 257/E33.068, E51.02, 613; 438/479  
See application file for complete search history.

(56) References Cited

PUBLICATIONS

Yu-Lun Chueh, Zhiyong Fan, Kuniharu Takei, Hyunhyub Ko, Rehan Kapadia, Asghar A. Rathore, Nate Miller, Kyoungsik Yu, Ming Wu, E. E. Haller and Ali Javey. "Black Ge Based on Crystalline/Amorphous Core/Shell Nanoneedle Arrays," Nano Lett., 2010, 10 (2), pp. 520-523, Publication Date (Web): Dec. 30, 2009.*

* cited by examiner

*Primary Examiner* — Yu-Hsi D Sun  
*Assistant Examiner* — Christina Sylvia  
(74) *Attorney, Agent, or Firm* — Lawrence Berkeley National Laboratory

(57) ABSTRACT

Direct growth of black Ge on low-temperature substrates, including plastics and rubber is reported. The material is based on highly dense, crystalline/amorphous core/shell Ge nanoneedle arrays with ultrasharp tips (~4 nm) enabled by the Ni catalyzed vapor-solid-solid growth process. Ge nanoneedle arrays exhibit remarkable optical properties. Specifically, minimal optical reflectance (<1%) is observed, even for high angles of incidence (~75°) and for relatively short nanoneedle lengths (~1 μm). Furthermore, the material exhibits high optical absorption efficiency with an effective band gap of ~1 eV. The reported black Ge can have important practical implications for efficient photovoltaic and photodetector applications on nonconventional substrates.

15 Claims, 8 Drawing Sheets

BLACK GE BASED ON CRYSTALLINE/AMORPHOUS CORE/SHELL NANONEEDLE ARRAYS

CROSS REFERENCE TO RELATED APPLICATIONS

This U.S. Utility Application claims priority to U.S. Provisional Application Ser. No. 61/426,166 filed Dec. 22, 2010, entitled Black GE Based on Crystalline/Amorphous Core/Shell Nanoneedle Arrays, Ali Javey, et al. inventors, the contents of which provisional application is incorporated herein as if fully set out in its entirety.

STATEMENT OF GOVERNMENTAL SUPPORT

The invention described and claimed herein was made in part utilizing funds supplied by the U.S. Department of Energy under Contract No, DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

1. Field of the Invention

This invention relates generally to a novel method and composition of matter, and more particularly to a novel method for the direct growth of 3D micro/nanostructures that have the capacity to reduce light reflection while enhancing absorption efficiency. In one embodiment, by the method of this invention, vertical cone-shaped pillars of Ge are directly formed on a wide range of substrates, the formed nanoneedle (NN) arrays offering a gradually reducing effective refractive index of the material from the bottom to the top.

2. Brief Description of the Related Art

To achieve more efficient approaches to absorption of light, exploration of novel three-dimensional structures with relevant material systems has been undertaken. For instance, in the case of 3D micro/nanostructures, they have been shown to reduce light reflection while enhancing the absorption efficiency. Vertical cone-shaped pillars are attractive in this regard due to the gradual reduction of the effective refractive index of the material from the bottom to the top. Based on this concept, black Si has been demonstrated in the past by utilizing various processes, including femto-second laser bombardment or patterned etching of the surface of bulk silicon and thin film (TF) substrates. Black Si has been widely explored for photovoltaic and photodiode applications. Due to its smaller bandgap and unique optical properties, germanium (Ge) planar and non-planar structures have also been widely studied for infrared photodetector and photodiode applications. What is needed for Ge, still is a simple and efficient method for growing Ge cone shaped structures, the method also suitable for the growth of such structures on a number of types of substrates.

SUMMARY OF THE INVENTION

By way of this invention a direct synthesis of black Ge on a wide range of substrates, including glass, plastics, and rubbers using a low temperature process is described. The resulting black Ge consists of quasi-vertical crystalline/amorphous core/shell Ge nanoneedle arrays grown by nickel (Ni) catalyzed chemical vapor deposition processes. The structures exhibit minimal reflectance even at large angles of incidence with an effective band gap of ~1 eV.

BRIEF DESCRIPTION OF THE DRAWINGS

The foregoing aspects and others will be readily appreciated by the skilled artisan from the following description of illustrative embodiments when read in conjunction with the accompanying drawings.

FIGS. 3(c), and (d) are optical images of a bent Kapton substrate and stretched rubber substrate with the Ge NNs grown on the surface. Notably, the substrates exhibit a visually black appearance.

FIG. 4(a) presents optical images of Ge NNs with different needle lengths grown on glass substrates, demonstrating the visually black appearance for L≥1.1 µm. FIG. 4(b) is a plot of the reflectance spectra of Ge thin film (TF), Ge nanowires (NWs) (d~30 nm, L~20 µm), and Ge NNs with different lengths. The inset shows the optical images of three representative substrates. FIG. 4(c) is a plot of the angular dependent reflectance measurements at 780 nm for Ge TF and Ge NNs (L~1.1 µm).

DETAILED DESCRIPTION

Figure 1:
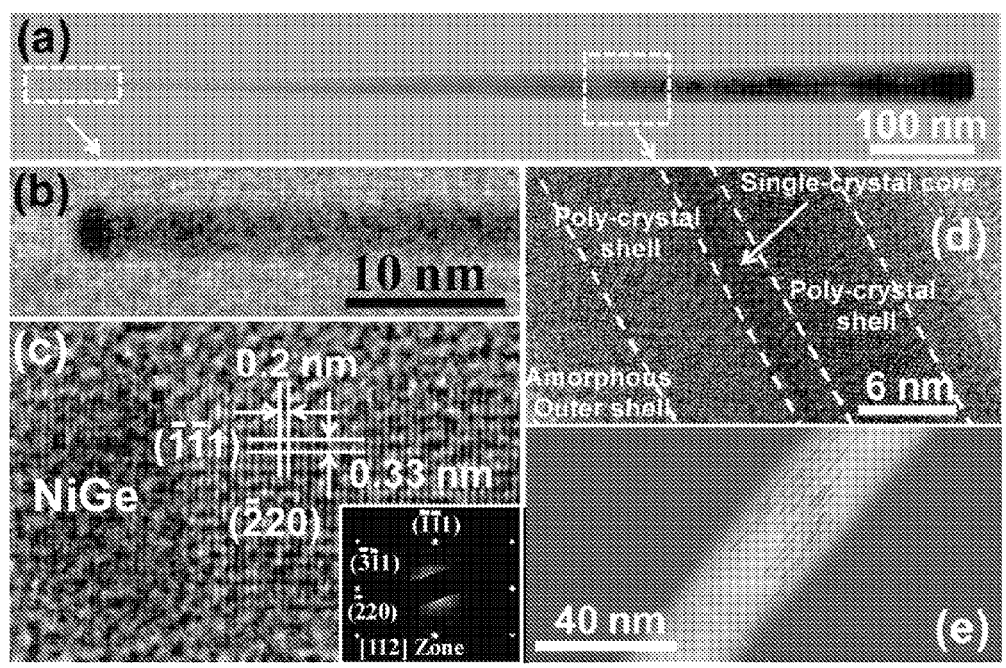
FIGS. 1(a) and (b) are TEM images showing ultrasharp Ge NNs.
FIG. 1(c) is a high resolution TEM (HRTEM) image of the nanoneedle tip, showing the NiGe catalytic seed. The inset shows the diffraction pattern with [110] growth direction.
FIG. 1(d) is an HRTEM image from midsection of a NN where the single crystalline Ge core with polycrystalline and amorphous Ge shells are distinctly observed.
FIG. 1(e) is the EDS line profile, which reveals that the NN structure is pure Ge.
Figure 6:
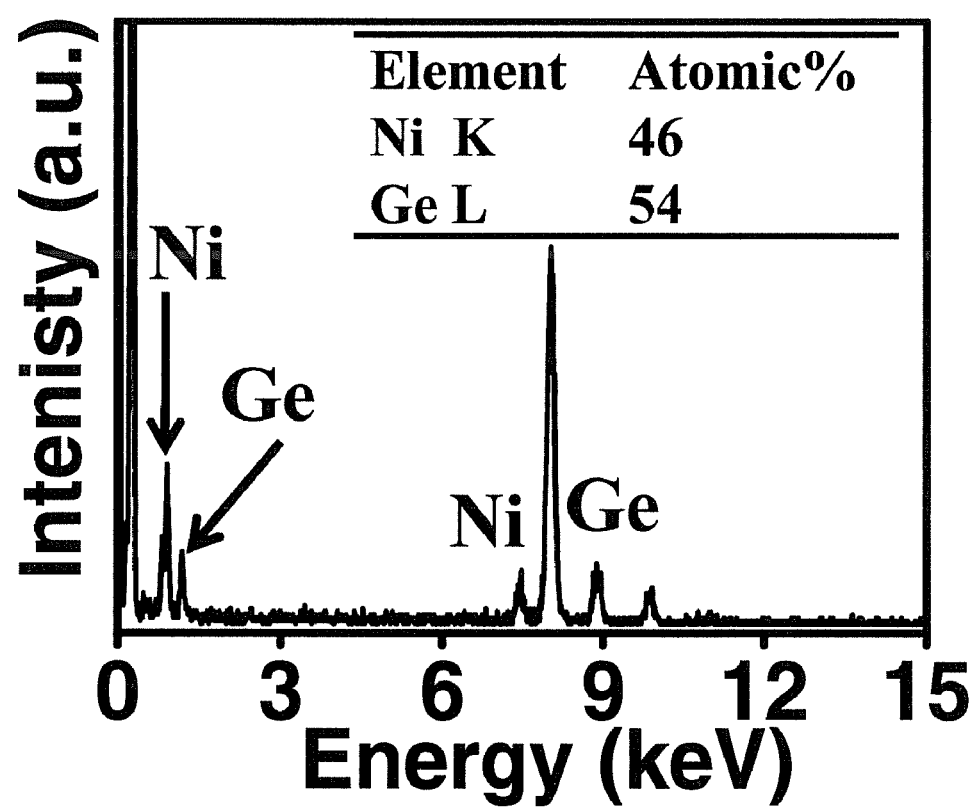
FIG. 6 is a plot of the EDA spectrum of the NiGe catalytic seed at the tip of a NN, showing ~1:1 Ni:Ge atomic composition.

The method of this invention for the direct growth of Ge nanoneedles will now be described. To grow Ge NNs, a thin film of Ni (~0.5 nm thick) was thermally evaporated on the substrate, followed by the growth at a sample temperature of 270-320° C. and a pressure of 1.8-280 Torr with $GeH_4$ (12 sccm, 10% balanced in $H_2$) used as the precursor gas. A representative transmission electron microscope (TEM) image of a Ge NN grown by this process is shown in FIG. 1a, depicting the tapered feature with the tip and base diameters of ~4 and 70 nm, respectively. The high resolution TEM (HRTEM) image of the NN tip highlights a dome shaped catalyst with an atomic composition of 1:1, Ni:Ge from energy dispersive spectroscopy (EDS) shown in FIG. 6. The presence of the NiGe catalyst at the tip suggests that the growth mechanism is via either the vapor-liquid-solid (VLS) or the vapor-solid-solid (VSS) process. However, the growth temperature of 270-320° C. used in the present study is far below the eutectic temperature of the NiGe system (763° C.), suggesting that the growth of the NNs is most likely via the VSS mechanism.

Figure 7:
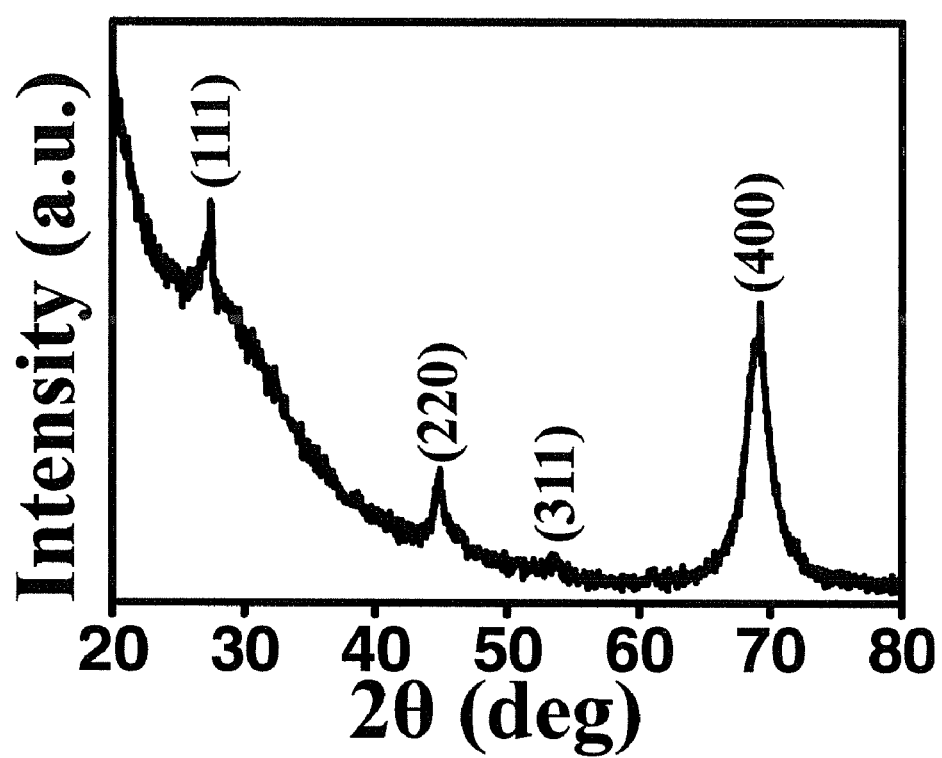
FIG. 7 is a plot of XRD measurements for Ge NN arrays grown at 270° C. at a growth pressure of 40 Torr.
Figure 8:
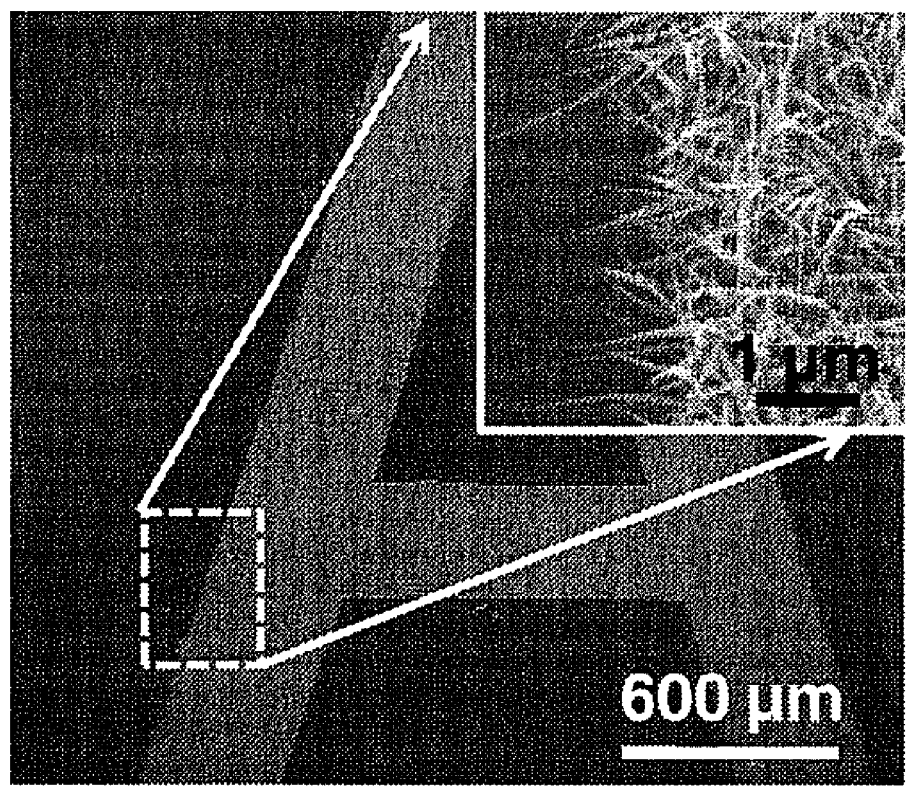
FIG. 8 is a SEM image of Ge NNs grown from a patterned region. The inset shows the corresponding high magnification SEM image of Ge NNs.

The HRTEM analysis clearly shows that the NNs consist of three layers, namely, amorphous outer shell, a polycrystalline inner shell, and an ultrathin single crystalline core (FIG. 1d). The growth direction of the NN core is mainly along [110] (FIG. 1c). The EDS elemental profile indicates that the entire structure is pure Ge (FIG. 1e). This is also consistent with X-ray diffraction (XRD) analysis showing three main peaks, (111), (220), and (311) as depicted in FIG. 7. The formation of the shells, we believe, is due to the lateral deposition of Ge atoms along the surface, resulting in the vapor-solid (VS) growth. Beyond a critical thickness of 5-10 nm, the shell becomes amorphous due to the lack of thermal energy for perfect epitaxial deposition.

Figure 2:
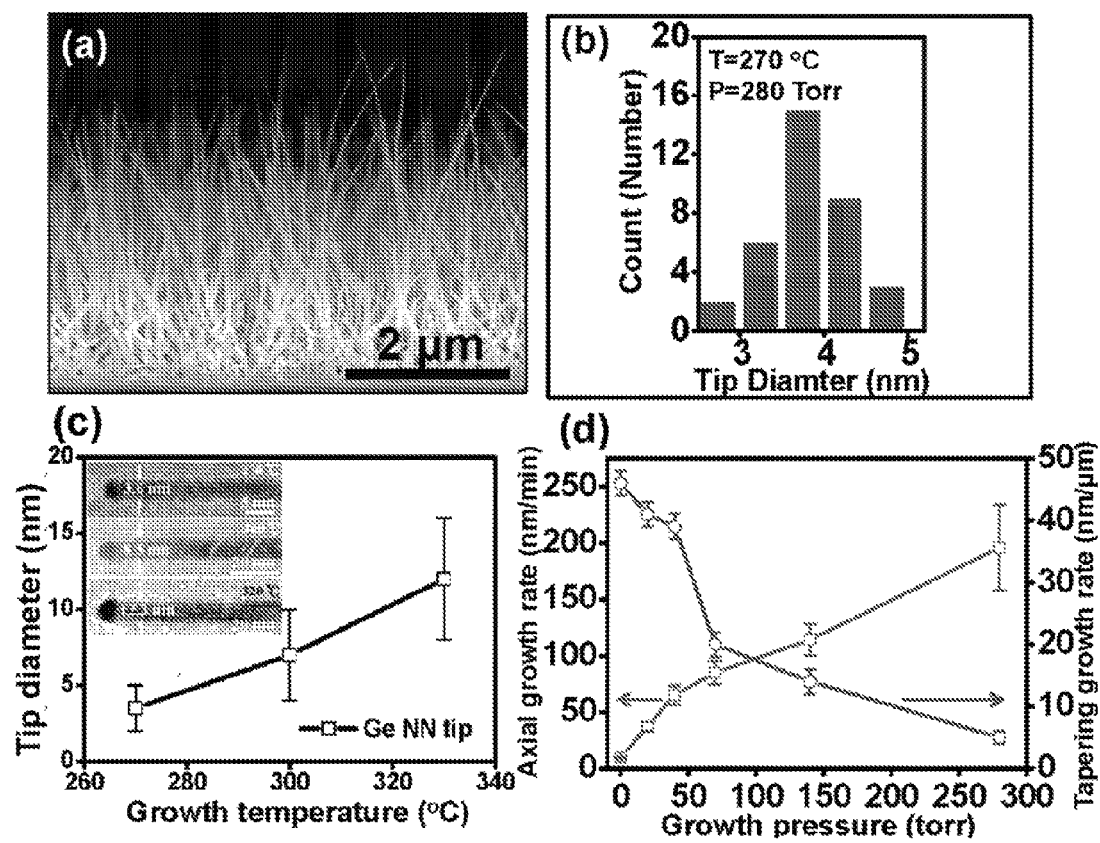
FIG. 2(a) is a SEM image of Ge NN arrays grown on a $Si/SiO_2$ substrate at 270° C. at a pressure of 280 Torr.
FIG. 2(b) is a histogram of the tip diameter of Ge NNs grown at 270° C.
FIG. 2(c) is a plot of the average tip diameter as a function of growth temperature. The inset shows representative TEM images of NNs grown at different temperatures.
FIG. 2(d) is a plot of the axial growth rate and tapering rate of Ge NNs at 280° C. as a function of growth pressure.

A scanning electron microscopy (SEM) image of a Ge NN array is shown in FIG. 2a, depicting the quasi-vertical orientation of the NNs arising from the steric interactions of the highly dense array (~40 NNs/μm$^2$). The average tip diameter of the grown NNs is ~4 nm as analyzed by TEM (FIG. 2b). The ultrasharp tip, thinner than the smallest diameter Ge NWs which can be grown by Au nanoparticles, is attributed both to the size of the Ni nanoparticles formed from thin film evaporation, and the minimal coalescence during growth.

To explore the detailed growth mechanism of Ge NNs, different growth temperatures and pressures were systematically explored. As the growth temperature is increased from 270° C. to 320° C. at a fixed growth pressure of 280 Torr, the tip diameter monotonically increases from ~4 to 13 nm (FIG. 2c). The increased tip diameter with growth temperature is most likely due to the formation of larger Ni metal nanoparticle catalysts at higher temperatures prior to the initiation of the growth. However, Ge NNs are not grown as the growth temperature is reduced below ~260° C., arising from the lack of reactivity of germane precursor and/or Ni catalytic seeds at such low temperatures. In addition, by increasing the growth pressure from 1.8 to 280 Torr at a fixed growth temperature of 270° C., the axial growth rate is increased from ~10 to 200 nm/min (FIG. 2d) due to the increased partial pressure of germane and higher incorporation rate of Ge atoms into the NiGe catalytic seeds. Meanwhile, the tapering rate, defined as the radial deposition rate over the axial growth rate decreases as the pressure is increased (FIG. 2d). This can be explained by the phase diagram of the NiGe system that favors the VSS/VLS growth processes over non-catalytic radial deposition at higher pressures and lower temperatures. A similar trend was previously observed and reported for Au-catalyzed Si nanowires.

Figure 3:
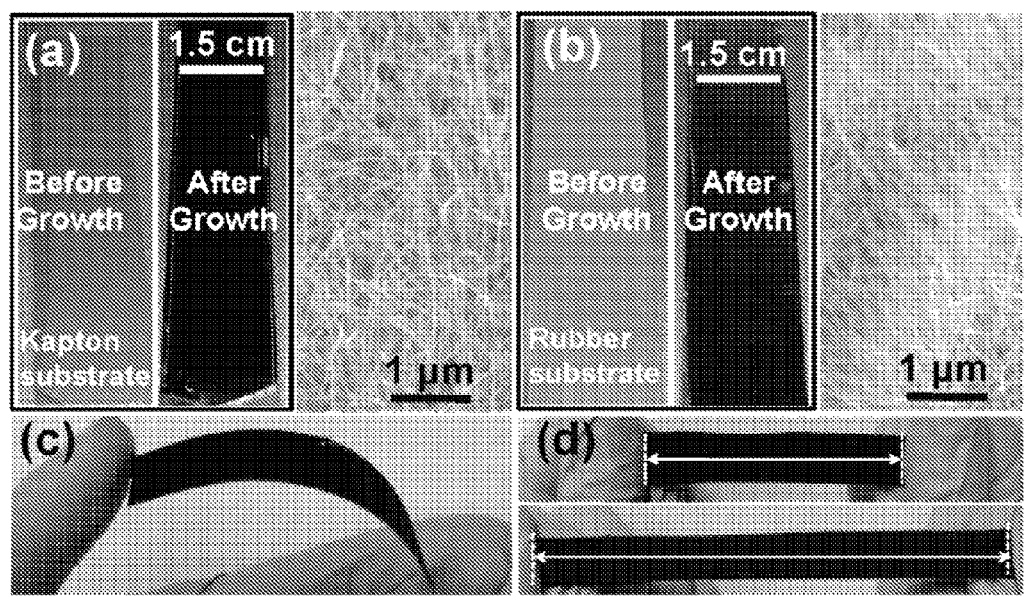
FIG. 3 contains photographs depicting the results of direct growth of Ge NNs on deformable substrates. Optical and SEM images of Ge NNs grown on (a) flexible Kapton and (b) high temperature rubber substrates are shown in FIG. 3(a) and FIG. 3(b) respectively.

The low-temperature growth process enables the direct synthesis of Ge NN arrays on a wide range of substrates, including flexible Kapton and stretchable rubber substrates (FIG. 3a, b). The grown NNs are highly uniform over large areas. The ability to directly grow highly dense Ge NN arrays with unique optical properties on deformable substrates could potentially enable the exploration of a wide range of novel optoelectronic applications. Notably, the grown Ge NN arrays exhibit a black visual appearance (FIG. 3a, b), despite the relatively small length of NNs (L~3 μm). This suggests that the NN arrays exhibit high absorption efficiency with minimal reflectance.

In addition, patterned growth of Ge NNs can be readily achieved on substrates by patterning the Ni thin film regions prior to the growth, further depicting the catalytic role of Ni particles in the growth of the NNs. To demonstrate this, Ni thin films were pattern-deposited by using conventional photo lithography and lift-off processes. FIG. 7 presents a SEM image of a patterned area after the growth, clearly manifesting that Ge NNs are only grown on Ni patterned regions.

Figure 4:
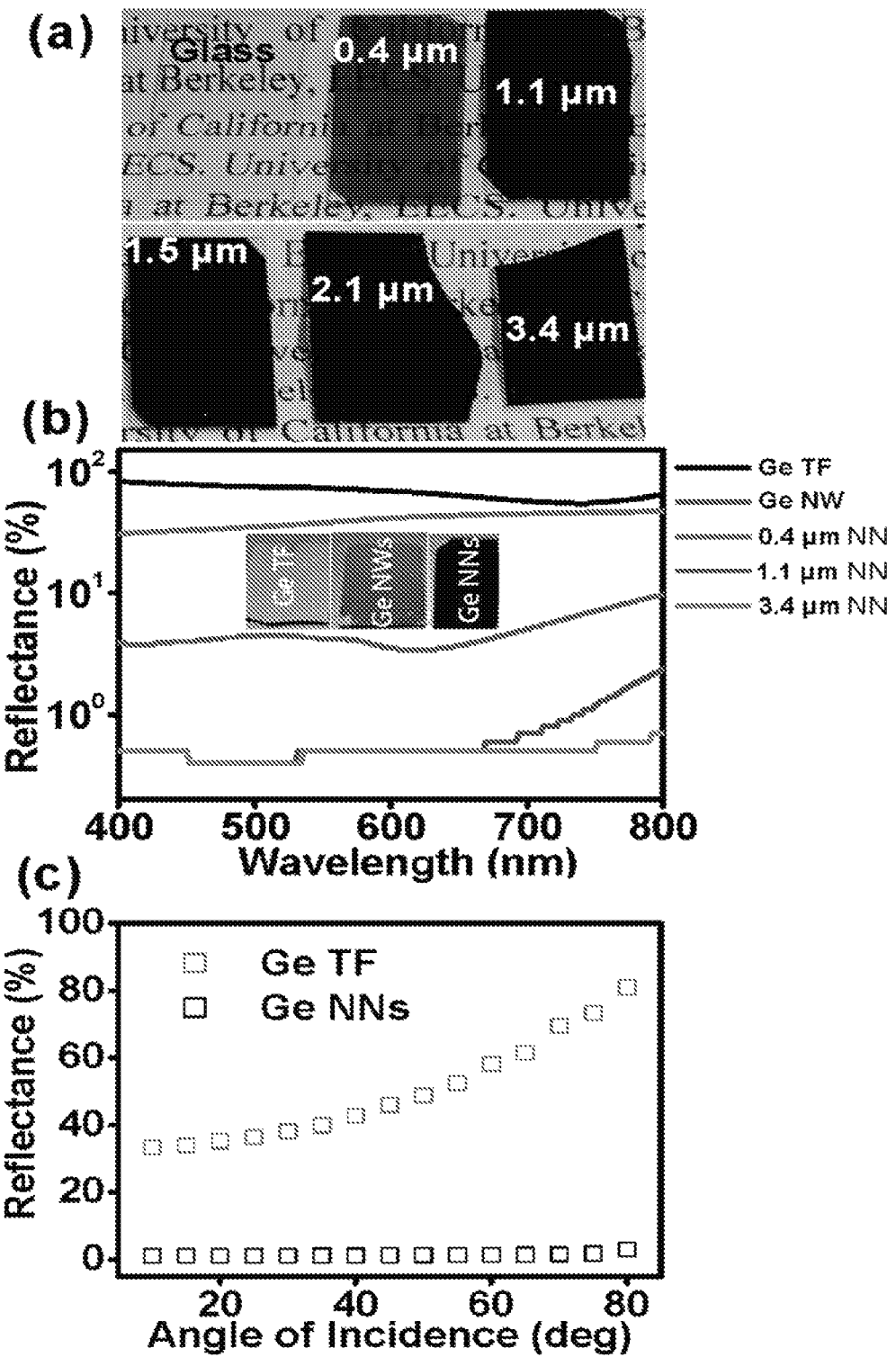
FIG. 4 depicts reflectance studies of Ge NN arrays.

Reflectance measurements were performed to characterize the optical properties of Ge NN arrays. For this study, Ge NNs were grown on transparent glass substrates. The corresponding optical images of Ge NN arrays with different lengths (L) 0.4-3.4 μm) are shown in FIG. 4a. As is evident, the substrates are completely opaque for NN lengths>1 μm with a black visual appearance. FIG. 4b shows the reflectance at normal incidence versus wavelength for Ge NN arrays with different lengths as well as Au-catalyzed Ge nanowire (NW) arrays (d~30 nm, L~20 μm) and a Ge thin film (TF) (~1 μm thick) substrates. When comparing the substrates with NNs to the TF, it is clear that a drastic reduction of reflectance occurs for NN length>1 μm. Beyond this length, the NN arrays exhibit a reflectance of <1% for all wavelengths. In contrast, Ge NWs of all lengths, even as high as ~20 μm, exhibited a reflectance of 2-10%, inferior to the NN arrays. As compared to the previously published works in the literature, black Ge produced by etching has been shown to have a reflectance of ~3%.

The remarkably low reflectance of Ge NN arrays can be attributed to (i) the cone-shaped feature of the structures with ultrasharp (~4 nm) tips and (ii) their near vertical orientation arising from their high surface density as enabled by the Ni catalytic growth. Specifically, Ge NNs with L>1.1 μm, exhibit ~10 and ~100 times reduction in reflectance as compared to Ge NWs and TF samples, respectively (FIG. 4b). The optical images of Ge TF, NWs (d~30 nm, L~20 μm) and NNs (L<1.1 μm) substrates also clearly show the drastic reflectance suppression for NNs as compared to both NWs and TF (FIG. 4b). For instance, the Ge TF substrate exhibits a shiny surface while the Ge NW arrays exhibit a brown color. This is in distinct contrast to the NN samples that exhibit a black visual appearance. To further characterize the anti-reflective properties, angular dependent reflectance measurements were performed on the Ge NN arrays (FIG. 4c). The reflectance spectra of the TF and 1.1 μm NN array with incident angle varied from ~30 to 85 degrees was collected by using a diode laser with a wavelength of 780 nm as the light source, This angular dependent measurement shows that Ge NN array exhibits minimal reflectance, even at high incident angles.

The observed reflectance behavior can be explained by using the concept of effective refractive index, which is defined as the weighted average of the refractive index of air and Ge by area. This concept of gradual refractive index has been theoretically suggested to explain the low reflectance observed from moth eyes and has been experimentally demonstrated by several research groups with tapered or conical-shaped vertical structures. Similarly in our study, the large Fresnel reflection observed on planar Ge surface due to the large refractive index mismatch between the air (n=1) and Ge (n=5.4 at 633 nm) has been significantly reduced through a smooth transition of the refractive index from the ultrathin tip to the base of the tapered Ge NN near vertical arrays. This smooth transition of refractive index is more efficient than the stepwise graded refractive index in multilayer structures fabricated by complicated procedures. In addition, the conical-shaped vertical structures have been known to have advantages over multilayer anti-reflectors in terms of broad range of spectral bandwidths and incident angles. This causes the NN arrays with ultrasharp tips to behave as an excellent anti-reflective coating.

Figure 5:
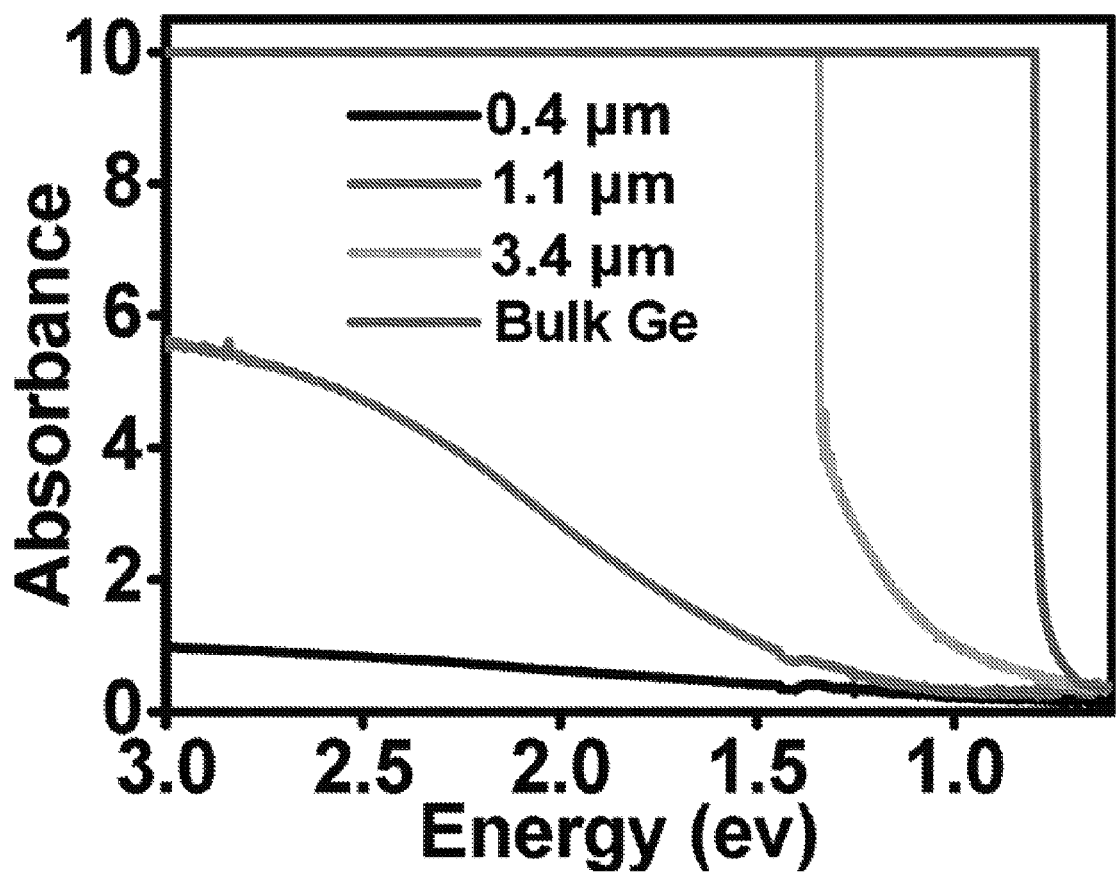
FIG. 5 is a plot of the absorption spectra of bulk Ge and Ge NN arrays with the lengths from 0.4 to 3.4 µm.

Another important materials property for a number of optical and optoelectronic applications is the band gap. To obtain the effective band gap of Ge NN arrays, optical absorption spectroscopy was performed for NN arrays with lengths from 0.4 to 3.4 µm (FIG. 5). As evident from the absorption spectra, Ge NN arrays with L~3.4 µm nearly fully absorb the light for >1.2 eV, therefore, exhibiting a high absorption coefficient. The linear extrapolation to zero from $\alpha(E)^{1/2}$ as a function of photon energy yields an effective bandgap of $E_g$~1 eV for Ge NNs. This band gap is larger than that of bulk crystalline Ge (~0.6 eV) but close to that of the amorphous Ge (~1.1 eV). The observed $E_g$~1 eV for Ge NNs is attributed to the combination of amorphous Ge outer shell and the quantum size-effects due to the ultrathin (~4 nm) crystalline core since the exciton Bohr radius of Ge is 17.7 nm. In the future, further detailed characterization may be needed to more clearly elucidate the observed band gap shift. From a practical point of view, an advantage of this bandgap shift lies in the potential use of Ge NNs as an absorber material for solar cell applications, more closely matching the solar spectrum peak. The combination of larger $E_g$, low reflectance, and high absorption efficiency may allow for a greater portion of solar energy to be converted into electrical energy, while keeping the overall materials thickness rather small. Since Ge NNs can be directly grown on plastic and rubber substrates, exploration of mechanically flexible photovoltaics may be feasible. Furthermore, Ge NNs are a promising material system for photo detectors, potentially exhibiting high detection sensitivity.

In summary, we report the growth of quasi-vertical Ge amorphous/crystalline core-shell nanoneedles by using Ni thin films as the catalyst via the VSS growth mechanism. The NNs exhibit a tapered structure with an average tip diameter as small as ~4 nm. By varying the growth temperature and pressure, the morphology and structure can be readily modified. The 3D structural configuration of Ge NNs results in superior antireflective properties due to the gradual reduction of the effective refractive index from the tip to the base of the highly dense NN arrays with ultrasharp tips. Because of the low reflectance and high optical absorption efficiency of the NN arrays, along with the ability to directly grow the material on low temperature substrates, various optoelectronics applications based on the reported black Ge may be envisioned in the future.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. A method for forming a nanoneedle array of germanium on a substrate, the method comprising;
   evaporating a thin film of nickel onto a substrate;
   introducing $GeH_4$ gas into a CVD chamber into which the nickel coated substrate has been placed; and thereafter,
   heating the chamber to between 270° C. and 320° C. for a period of time, while maintaining a pressure of 1.8-280 Torr during the heating step.

2. The method of claim 1 wherein the nickel film is grown to a thickness of 0.5 nm.

3. The method of claim 1 wherein said $GeH_4$ gas is introduced as a mixture of 10% $GeH_4$ in $H_2$.

4. The method of claim 1 wherein the pressure is maintained at about 280 Torr.

5. The method of claim 1 wherein the substrate is glass.

6. The method of claim 1 wherein the substrate is a deformable substrate.

7. The method of claim 1 wherein the deformable substrate is selected from the group comprising flexible Kapton and stretchable rubber.

8. An array of germanium cone shaped nanoneedles formed on a substrate according to the process of claim 1, wherein the tip diameter of the nanoneedles is between 4 to 13 nm.

9. The array of claim 8 wherein the tip diameter of the nanoneedles is approximately 4 nm.

10. The array of claim 8 wherein the nanoneedles are of near vertical orientation.

11. The array of claim 10 wherein the nanoneedles have a length of between 0.4 µm and 3.4 µm.

12. The array of claim 11 wherein the nanoneedles exhibit a gradual reduction of effective refractive index from the bottom to the top of the needle.

13. The array of claim 11 wherein the nanoneedles have a length of ≥1.0 µm.

14. The array of claim 8 wherein the substrate is a deformable substrate.

15. The array of claim 14 wherein the deformable substrate is selected from the group comprising Kapton and stretchable rubber.

\* \* \* \* \*